US009350306B2

(12) United States Patent
Imai et al.

(10) Patent No.: US 9,350,306 B2
(45) Date of Patent: May 24, 2016

(54) AMPLIFICATION CIRCUIT, AMPLIFICATION DEVICE, AFE CIRCUIT, AND SIGNAL PROCESSING SYSTEM

(71) Applicant: KABUSHIKI KAISHA TOSHIBA, Tokyo (JP)

(72) Inventors: Shigeo Imai, Chiba Chiba (JP); Shinji Nakatsuka, Kamakura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 14/471,194

(22) Filed: Aug. 28, 2014

(65) Prior Publication Data

US 2015/0236661 A1     Aug. 20, 2015

(30) Foreign Application Priority Data

Feb. 17, 2014  (JP) ................................. 2014-027194

(51) Int. Cl.
*H03F 3/45*  (2006.01)

(52) U.S. Cl.
CPC ........ *H03F 3/45475* (2013.01); *H03F 3/45977* (2013.01); *H03F 3/45995* (2013.01); *H03F 2203/45116* (2013.01); *H03F 2203/45171* (2013.01); *H03F 2203/45522* (2013.01); *H03F 2203/45591* (2013.01)

(58) Field of Classification Search
CPC ..................................................... H03F 3/45
USPC ........................................... 330/69, 254, 260
See application file for complete search history.

(56) References Cited

U.S. PATENT DOCUMENTS

| 4,107,618 | A | * | 8/1978 | Ormond ........................... 330/51 |
| 5,990,737 | A | * | 11/1999 | Czarnul et al. ................... 330/69 |
| 6,734,730 | B2 | | 5/2004 | Doi et al. |
| 9,166,573 | B2 | * | 10/2015 | Yoshizawa |
| 2014/0191796 | A1 | | 7/2014 | Yoshizawa |

FOREIGN PATENT DOCUMENTS

| JP | H06085570 A | 3/1994 |
| JP | 2003-243594 A | 8/2003 |
| JP | 2013031089 A | 2/2013 |

* cited by examiner

*Primary Examiner* — Henry Choe
(74) *Attorney, Agent, or Firm* — Patterson & Sheridan, LLP

(57) ABSTRACT

According to one embodiment, an amplification circuit includes first and second differential amplification circuits, each having an output connected to an output terminal and a feedback resistor connected between the output and a negative input of the respective differential amplification circuit. The amplification circuit includes a switching circuit that receives a first signal on first input terminal and a second signal on a second input terminal and includes set of switches that is configured to apply the first and second signals to the first and second differential amplification circuits such that in a first switching state an amplified voltage difference of the first and second signals is available between the two output terminals, and in a second switching state an amplified current difference of the first and second signals is available between the two output terminals.

20 Claims, 3 Drawing Sheets

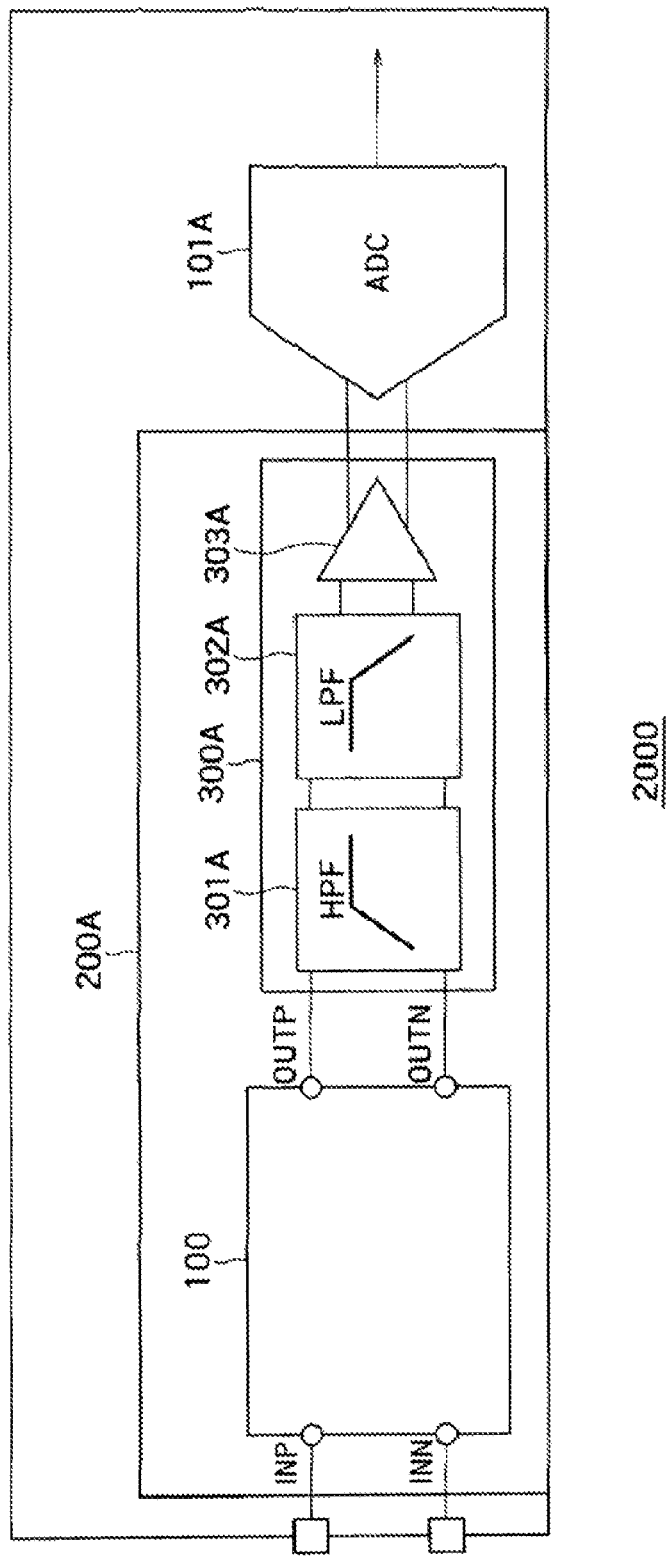

AMPLIFICATION CIRCUIT, AMPLIFICATION DEVICE, AFE CIRCUIT, AND SIGNAL PROCESSING SYSTEM

CROSS-REFERENCE TO RELATED APPLICATION

This application is based upon and claims the benefit of priority from Japanese Patent Application No. 2014-027194, filed Feb. 17, 2014, the entire contents of which are incorporated herein by reference.

FIELD

Embodiments described herein relate generally to an amplification circuit, an amplification device, an AFE (Analog Front End) circuit, and a signal processing system.

BACKGROUND

In the related art, when physical information is obtained and supplied to a processor, it is necessary to convert the analog output (an analog value) of the physical sensor to a digital value. To perform this conversion an amplification circuit is generally required to adjust the output of the sensor to an input signal specification of an analog-to-digital conversion circuit before A/D conversion is carried out.

Furthermore, output modes of the sensor are broadly classified into a voltage mode and a current mode. Therefore, it is necessary to arrange the amplification circuit according to various sensor outputs (a voltage and a current) and an AFE (analog front end) circuit using the amplification circuit, thereby causing an area occupied by the amplification circuit and the AFE circuit using the amplification circuit in a chip, to be enlarged.

DESCRIPTION OF THE DRAWINGS

FIG. 3 is a diagram of another example of a configuration of a signal processing system to which the amplification circuit illustrated in FIG. 1 is applied.

DETAILED DESCRIPTION

Embodiments provide an amplification circuit that is capable of reducing circuit area while corresponding to a specification of an input signal.

In general, according to one embodiment, an amplification circuit includes a first differential amplification circuit having an output connected to a first output terminal. The amplification circuit includes a first feedback resistor that is connected between the output of the first differential amplification circuit and a negative input of the first differential amplification circuit. The amplification circuit includes a second differential amplification circuit, having an output connected to a second output terminal. The amplification circuit includes a second feedback resistor that is connected between the output of the second differential amplification circuit and a negative input of the second differential amplification circuit. The amplification circuit includes a switching circuit that receives a first signal on a first input terminal and a second signal on a second input terminal, where the switching circuit includes a set of switches that are configured to apply the first and second signals to the first and second differential amplification circuits such that in a first switching state an amplified voltage difference of the first and second signals is available between the two output terminals, and in a second switching state an amplified current difference of the first and second signals is available between the output terminals.

The switching circuit switches between a first switching state in which the first input terminal and the positive input of the first differential amplification circuit are electrically connected, the second input terminal and the positive input of the second differential amplification circuit are electrically connected, and the negative input of the first differential amplification circuit and the negative input of the second differential amplification circuit are connected through a resistor, and a second switching state in which the first input terminal and the negative input of the first differential amplification circuit are electrically connected, the second input terminal and the negative input of the second differential amplification circuit are electrically connected, and the positive input of the first differential amplification circuit and the positive input of the second differential amplification circuit are connected to a fixed electric potential.

Hereinafter, each embodiment will be described with reference to the drawings.

First Embodiment

Figure 1:
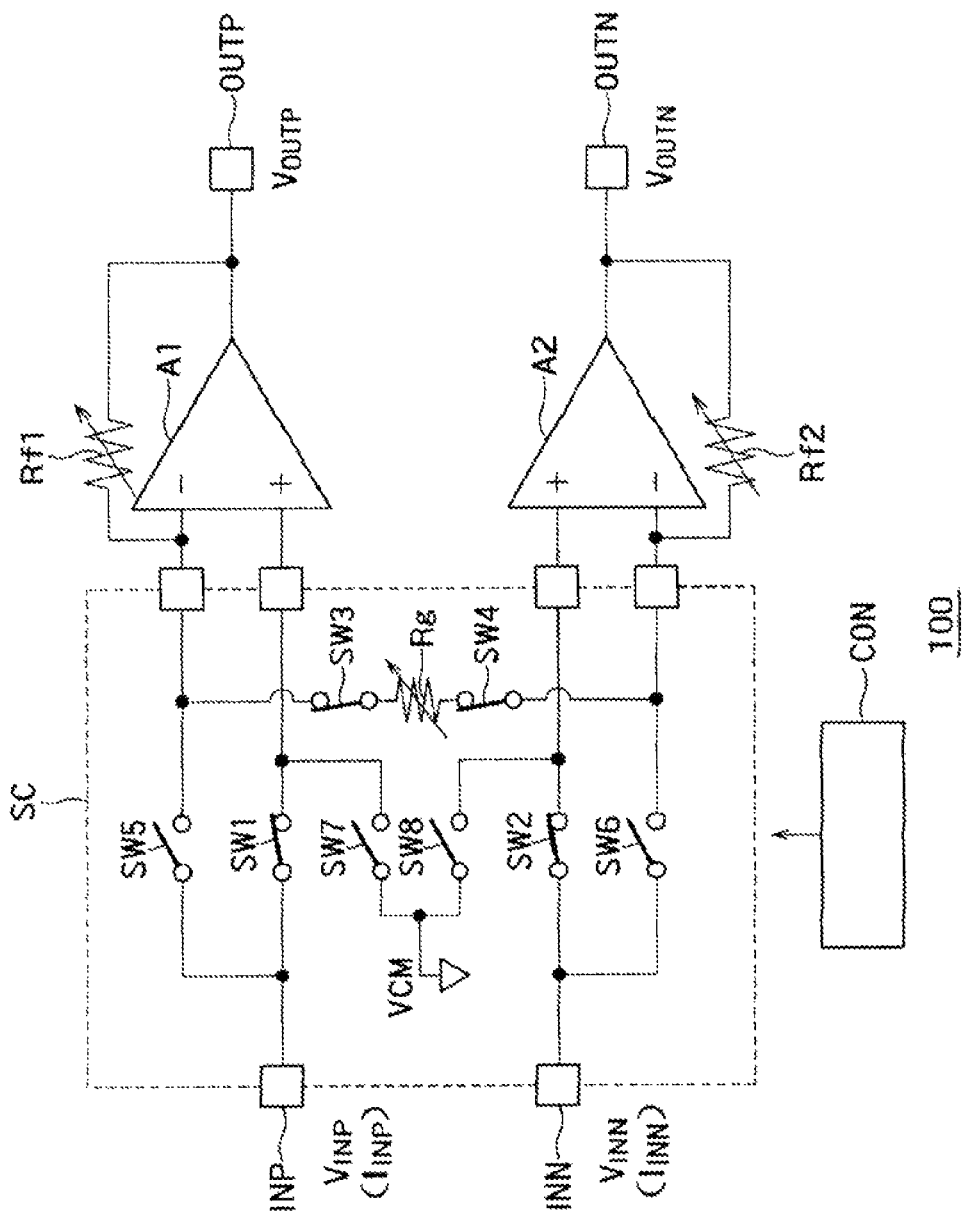
FIG. 1 is a diagram illustrating an example of a configuration of an amplification circuit according to a first embodiment.

FIG. 1 is a diagram illustrating an example configuration of an amplification circuit 100 according to a first embodiment.

As illustrated in FIG. 1, the amplification circuit 100 includes a first input terminal INP, a second input terminal INN, a first output terminal OUTP, a second output terminal OUTN, a first differential amplification circuit A1, a second differential amplification circuit A2, a first feedback resistor Rf1, a second feedback resistor Rf2, a switching circuit SC, and a control circuit CON.

The first input terminal INP receives a voltage $V_{INP}$ (or a current $I_{INP}$).

The second input terminal INN receives a voltage $V_{INN}$ (or a current $I_{INN}$).

The first output terminal OUTP outputs a voltage $V_{OUTP}$.

The second output terminal OUTN outputs a voltage $V_{OUTN}$.

An output of the first differential amplification circuit A1 is connected to the first output terminal OUTP.

The first feedback resistor Rf1 is connected between the output of the first differential amplification circuit A1 and a negative input (indicated as the (−) input of circuit A1 in FIG. 1A) of the first differential amplification circuit A1.

An output of the second differential amplification circuit A2 is connected to the second output terminal OUTN.

The second feedback resistor Rf2 is connected between the output of the second differential amplification circuit A2 and a negative input (indicated as the (−) input of circuit A2 in FIG. 1A) of the second differential amplification circuit A2.

Furthermore, the first feedback resistor Rf1 and the second feedback resistor Rf2 are, for example, variable resistors.

Furthermore, a resistance value of the first feedback resistor Rf1 is set equal to a resistance value of the second feedback resistor Rf2 in this embodiment.

In addition, the switching circuit SC switches signals input at the first input terminal INP and the second input terminal INN, respectively, and supplies the signals to a positive input of the first differential amplification circuit A1 and a positive input of the second differential amplification circuit A2, or the negative input of the first differential amplification circuit A1 and the negative input of the second differential amplification circuit A2.

When the switching circuit SC is, for example, in a first switching state (a state illustrated in FIG. 1), the first input terminal INP and the positive input of the first differential amplification circuit A1 are electrically connected, the second input terminal INN and the positive input of the second differential amplification circuit A2 are electrically connected, and the negative input of the first differential amplification circuit A1 and the negative input of the second differential amplification circuit A2 are connected through an intermediate resistor Rg. Furthermore, the intermediate resistor Rg may be a variable resistor.

In the first switching state, the amplification circuit 100 operates as a voltage-input type AMP (amplifier).

The switching circuit SC can also be in a second switching state. in which the first input terminal INP and the negative input of the first differential amplification circuit A1 are electrically connected, the second input terminal INN and the negative input of the second differential amplification circuit A2 are electrically connected, and the positive input of the first differential amplification circuit A1 and the positive input of the second differential amplification circuit A2 are connected to a fixed electric potential VCM.

In the second switching state, the amplification circuit 100 operates as a current-input type AMP (amplifier).

Thus, when the switching circuit SC switches between the first switching state and the second switching state, thereby the amplification circuit 100 operates as a voltage-input type AMP or the current-input type AMP in which specifications of input signals are different from each other.

As illustrated in FIG. 1, the switching circuit SC includes, for example, a first switch element SW1, a second switch element SW2, a third switch element SW3, a fourth switch element SW4, a fifth switch element SW5, a sixth switch element SW6, a seventh switch element SW7, an eighth switch element SW8, and the intermediate resistor Rg. Furthermore, the first to the eighth switch elements SW1 to SW8 are, for example, MOS transistors.

The first switch element SW1 is connected between the first input terminal INP and the positive input of the first differential amplification circuit A1.

The second switch element SW2 is connected between the second input terminal INN and the positive input of the second differential amplification circuit A2.

One end of the third switch element SW3 is connected to the negative input of the first differential amplification circuit A1.

One end of the fourth switch element SW4 is connected to the negative input of the second differential amplification circuit A2.

The intermediate resistor Rg is connected between the other end of the third switch element SW3 and the other end of the fourth switch element SW4.

The fifth switch element SW5 is connected between the first input terminal INP and the negative input of the first differential amplification circuit A1.

The sixth switch element SW6 is connected between the second input terminal INN and the negative input of the second differential amplification circuit A2.

The seventh switch element SW7 is connected between the positive input of the first differential amplification circuit A1 and the fixed electric potential VCM.

The eighth switch element SW8 is connected between the positive input of the second differential amplification circuit A2 and the fixed electric potential VCM.

Furthermore, the fixed electric potential VCM is, for example, a ground potential. In addition, the fixed electric potential VCM may be ½ of a power supply voltage.

In addition, the control circuit CON controls the first to the eighth switch elements SW1 to SW8 according to an external signal.

An example of an operation of the amplification circuit 100 including a configuration as described above is now described.

In one configuration, the switching circuit SC switches the first, the second, the third, and the fourth switch elements SW1, SW2, SW3, and SW4 to ON, and the fifth, the sixth, the seventh, and the eighth switch elements SW5, SW6, SW7, and SW8 to OFF.

Accordingly, the switching circuit SC is in the first switching state when the first input terminal INP and the positive input of the first differential amplification circuit A1 are electrically connected, the second input terminal INN and the positive input of the second differential amplification circuit A2 are electrically connected, and the negative input of the first differential amplification circuit A1 and the negative input of the second differential amplification circuit A2 are connected through the intermediate resistor Rg.

In the first switching state, an output signal (the voltage difference $V_{OUTP}-V_{OUTN}$) and an input signal (the voltage difference $V_{INP}-V_{INN}$) of the amplification circuit 100 have a relationship expressed by the following formula (1). Furthermore, in the formula (1), the resistance values of the first and the second feedback resistors Rf1 and Rf2 are set to $R_f$, and the resistance value of the intermediate resistor Rg is set to $R_g$.

$$(V_{OUTP} - V_{OUTN}) = \left(1 + \frac{R_f + R_f}{R_g}\right) \cdot (V_{INP} - V_{INN}) \quad (1)$$

As expressed in the formula (1), the amplification circuit 100 operates as the voltage-input type AMP.

On the other hand, the switching circuit SC switches the first, the second, the third, and the fourth switch elements SW1, SW2, SW3, and SW4 to OFF, and the fifth, the sixth, the seventh, and the eighth switch elements SW5, SW6, SW7, and SW8 to ON.

Accordingly, the switching circuit SC is in the second switching state when the first input terminal INP and the negative input of the first differential amplification circuit A1 are electrically connected, the second input terminal INN and the negative input of the second differential amplification circuit A2 are electrically connected, and the positive input of the first differential amplification circuit A1 and the positive input of the second differential amplification circuit A2 are connected to the fixed electric potential VCM.

In the second switching state, the output signal (the voltage difference $V_{OUTP}-V_{OUTN}$) and the input signal (the current difference $I_{INP}-I_{INN}$) of the amplification circuit 100 have a relationship expressed by the following formula (2). Furthermore, in the formula (2), the resistance values of the first and the second feedback resistors Rf1 and Rf2 are set to $R_f$, and the resistance value of the intermediate resistor Rg is set to $R_g$.

$$(V_{OUTP}-V_{OUTN})=R_f(I_{INP}-I_{INN}) \quad (2)$$

As expressed in the formula (2), the amplification circuit 100 operates as the current-input type AMP.

Thus, switching the switching circuit SC between the first switching state and the second switching state described above, allows the amplification circuit 100 to be operated as the voltage-input type AMP or the current-input type AMP in which the specifications of the input signals are different from each other.

That is, even though the specifications of the input signals are different from each other, the amplification circuit 100 uses the same differential amplification circuit, thereby allowing a circuit area to be reduced.

As described above, according to the amplification circuit 100 of the first embodiment, it is possible to reduce the circuit area while corresponding to the specifications of the input signals.

Next, an example of a configuration of a signal processing system to which the amplification circuit 100 including the configuration as described above is applied is described.

Figure 2:
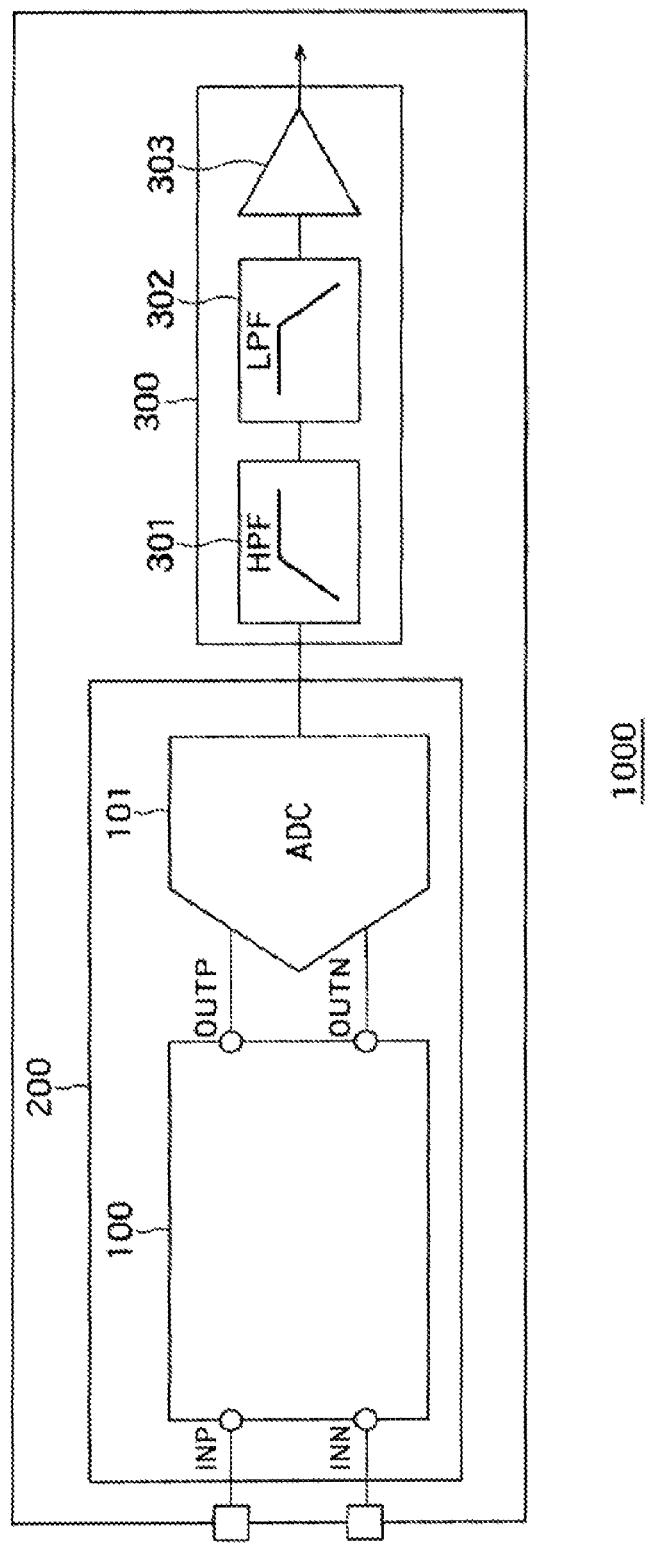
FIG. 2 is a diagram illustrating an example of a configuration of a signal processing system to which the amplification circuit illustrated in FIG. 1 is applied.

FIG. 2 is a diagram illustrating an example of a configuration of a signal processing system to which the amplification circuit 100 illustrated in FIG. 1 is applied.

As illustrated in FIG. 2, a signal processing system 1000 includes an AFE circuit 200, and a digital signal processing circuit 300 which processes digital signals output from the AFE circuit 200.

The AFE circuit 200 includes the amplification circuit 100 which amplifies the signals input to the first input terminal INP and the second input terminal INN and outputs the signals to the first output terminal OUTP and the second output terminal OUTN, and an ADC circuit 101 which converts the signals output from the amplification circuit 100 to digital signals.

That is, the AFE circuit 200 includes the ADC circuit 101 which converts an AMP output to a digital signal in a later stage of the amplification circuit 100 illustrated in FIG. 1, the circuit 100 thereby being configurable as a voltage input or a current input device as required.

In addition, the digital signal processing circuit 300 includes a high pass filter 301, a low pass filter 302, and an amplification unit 303.

The high pass filter 301 receives the signals output from the AFE circuit 200 and outputs a filtered signal.

The low pass filter 302 receives the signals output from the high pass filter 301 and outputs a filtered signal.

The amplification unit 303 amplifies the filtered signal output from the low pass filter 302 and outputs an amplified signal.

Thus, the signal processing system 1000 includes the digital signal processing circuit 300 that achieves a filter function for removing a DC component or an extraneous (noise) component from a converted digital signal in the later stage of the AFE circuit 200, or an amplification function for amplifying a signal by a digital signal. The AFE circuit 200 is configurable to accept a voltage-type input or a current-type input, and includes high performance filters and provides the amplification function on the digital signal.

FIG. 3 is a diagram illustrating another example of a configuration of a signal processing system to which the amplification circuit 100 illustrated in FIG. 1 is applied.

As illustrated in FIG. 3, a signal processing system 2000 includes an amplification device 200A, and an ADC circuit 101A which converts signals output from the amplification device 200A from analog to digital signals.

The amplification device 200A includes the amplification circuit 100, which amplifies the signals input to the first input terminal INP and the second input terminal INN, and outputs the signals to the first output terminal OUTP and the second output terminal OUTN, and an analog signal processing circuit 300A which processes the signals output from the amplification circuit 100.

That is, the amplification device 200A includes the analog signal processing circuit 300A which achieves the filter function for removing the DC component or the extraneous (noise) component after the amplification circuit 1001, or the amplification function on an analog signal. Amplification circuit 200A is configurable to accept either voltage input or the current input. The amplification circuit 200A performs filtering and amplification function on the analog signal.

The analog signal processing circuit 300A includes a high pass filter 301A, a low pass filter 302A, and an amplification unit 303A.

The high pass filter 301A receives the signals output from the amplification circuit 100, and outputs a filtered signal.

The low pass filter 302A receives the signals output from the high pass filter 301A and outputs a filtered signal.

The amplification unit 303A amplifies the signals output from the low pass filter 302A, and outputs an amplified signal.

Thus, the signal processing system 2000 includes the ADC circuit 101A which converts the AMP output to the digital signal after the amplification device 200A, which is configurable to operate on a voltage input or a current input. The amplification device 200A also includes filtering and the amplification functions operating on the analog signal. Accordingly, it is possible to improve signal process performance even in the ADC circuit 101A with low resolution.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplification circuit comprising:
    a first differential amplification circuit configured to output a first output signal at a first output terminal;
    a first feedback resistor that is connected between the first output terminal and a negative input of the first differential amplification circuit;
    a second differential amplification circuit configured to output a second output signal at a second output terminal;
    a second feedback resistor that is connected between the second output terminal and a negative input of the second differential amplification circuit; and
    a switching circuit including a plurality of switches and being configured to receive a first input signal at the first input terminal and a second input signal at a second input terminal, wherein
    the switching circuit has a first switching state in which the first and second input signals are provided to the first and second differential amplification circuits such that an amplified voltage difference of the first and second input signals is provided between the first and second output terminals, and a second switching state in which the first and second input signals are provided to the first and second differential amplification circuits such that an amplified current difference of the first and second signals is provided between the first and second output terminals.

2. The amplification circuit according to claim 1, wherein the switching circuit includes:

a first switch element connected between the first input terminal and a positive input of the first differential amplification circuit, a second switch element connected between the second input terminal and a positive input of the second differential amplification circuit, a third switch element connected between the negative input of the first differential amplification circuit and a first end of a resistor, a fourth switch element connected between the negative input of the second differential amplification circuit and a second end of the resistor, a fifth switch element connected between the first input terminal and the negative input of the first differential amplification circuit, a sixth switch element connected between the second input terminal and the negative input of the second differential amplification circuit, a seventh switch element connected between the positive input of the first differential amplification circuit and a fixed electric potential, and an eighth switch element connected between the positive input of the second differential amplification circuit and the fixed electric potential.

3. The amplification circuit according to claim 2, wherein in the first switching state the first, the second, the third, and the fourth switch elements are in an ON state, and the fifth, the sixth, the seventh, and the eighth switch elements are in an OFF state, and in the second switching state the first, the second, the third, and the fourth switch elements are in the OFF state, and the fifth, the sixth, the seventh, and the eighth switch elements are in the ON state.

4. The amplification circuit according to claim 2, further comprising:
a control circuit configured to control the first through the eighth switch elements according to an external signal.

5. The amplification circuit according to claim 1, wherein the first feedback resistor and the second feedback resistor are variable resistors.

6. The amplification circuit according to claim 1, wherein a resistance value of the first feedback resistor is equal to a resistance value of the second feedback resistor.

7. An AFE circuit, comprising:
the amplification circuit according to claim 1; and
an ADC circuit configured to convert analog signals output at the first and second output terminals of the amplification circuit to digital signals.

8. A signal processing system, comprising:
the AFE circuit according to claim 7; and
a digital signal processing circuit configured to receive digital signals from the AFE circuit and process the digital signals.

9. The system according to claim 8, wherein the digital signal processing circuit includes a high pass filter, a low pass filter, and an amplification unit.

10. An amplification device, comprising:
the amplification circuit according to claim 1; and
an analog signal processing circuit configured to processes analog signals received from the amplification circuit.

11. A signal processing system, comprising:
the amplification device according to claim 10; and
an ADC circuit configured to convert analog signals received from the amplification device to digital signals.

12. The signal processing system according to claim 11, wherein the analog signal processing circuit includes a high pass filter, a low pass filter, and an amplification unit.

13. The amplification circuit according to claim 1, wherein in the first switching state,
the first input terminal and a positive input of the first differential amplification circuit are electrically connected,
the second input terminal and a positive input of the second differential amplification circuit are electrically connected, and
the negative input of the first differential amplification circuit and the negative input of the second differential amplification circuit are connected through a resistor, and in the second switching state,
the first input terminal and the negative input of the first differential amplification circuit are electrically connected,
the second input terminal and the negative input of the second differential amplification circuit are electrically connected, and
the positive input of the first differential amplification circuit and the positive input of the second differential amplification circuit are connected to a fixed electric potential.

14. An amplification circuit, comprising:
first and second differential amplification circuits, each having a negative input terminal and a corresponding positive input terminal, the first differential amplification circuit providing a first output signal at a first output terminal, and the second differential amplification circuit providing a second output signal at a second output terminal, each of the first and second differential amplification circuits including a feedback resistor between a respective one of the first and second output terminals and the corresponding negative input terminal; and a switching circuit configured to receive first and second input signals, wherein in a first switching state of the switching circuit, the first signal and second signal are respectively connected to the positive input of the first and second differential amplification circuit, and the negative inputs of the first and second differential amplification circuits are connected to each other via a gain resistor, and in a second switching state of the switching circuit, the first and second signals are respectively connected to the negative inputs of the first and second differential amplification circuits, and the respective positive input of the first and second differential amplification circuits is connected to a fixed electric potential.

15. The amplification circuit according to claim 14, wherein the fixed electric potential is a ground potential.

16. The amplification circuit according to claim 14, wherein the gain resistor is a variable resistor.

17. The amplification circuit according to claim 14, wherein each feedback resistor is a variable resistor.

18. The amplification circuit according to claim 14, wherein the first and second input terminals are connected to a sensor element.

19. An AFE circuit, comprising:
first and second differential amplification circuits, each having a negative input terminal and a corresponding positive input terminal, the first differential amplification circuit providing a first output signal at a first output terminal, and the second differential amplification circuit providing a second output signal at a second output terminal, each of the first and second differential amplification circuits respectively including a feedback resistor connected between a respective one of the first and second output terminal and the corresponding negative input terminal;

a switching circuit configured to receive first and second input signals;

an ADC circuit including first and second ADC inputs configured to receive the first and second output signals and to convert analog signals to digital signals; and a digital signal processing circuit including:
- a first filter circuit configured to receive a digital output from the ADC circuit,
- a second filter circuit configured to receive a first filtered output from the first filter circuit, and
- a single-input amplifier configured to receive an second filtered output from the second filter circuit, wherein in a first switching state of the switching circuit, the first signal and second signal are respectively connected to the positive input of the first and second differential amplification circuit, and the negative inputs of the first and second differential amplification circuits are connected to each other via a gain resistor, and in a second switching state of the switching circuit, the first and second signals are respectively connected to the negative inputs of the first and second differential amplification circuits, and the positive inputs of the first and second differential amplification circuits are connected to a fixed electric potential.

20. The signal processing system according to claim 19, wherein the first filter circuit is a high-pass filter circuit and the second filter circuit is a low-pass filter circuit.

* * * * *